United States Patent
Chen et al.

(10) Patent No.: US 10,084,437 B1
(45) Date of Patent: Sep. 25, 2018

(54) POWER SUPPLY NOISE SENSOR

(71) Applicant: NXP USA, Inc., Austin, TX (US)

(72) Inventors: Jifeng Chen, Bee Cave, TX (US); Dat Tat Tran, Round Rock, TX (US); Anis Mahmoud Jarrar, Austin, TX (US); Jorge Arturo Corso, Austin, TX (US); LeRoy Winemberg, Austin, TX (US); Balaji Rajasekaran, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/666,026

(22) Filed: Aug. 1, 2017

(51) Int. Cl.
*H03K 5/12* (2006.01)
*H03K 5/1252* (2006.01)
*H03K 5/159* (2006.01)
*H03K 5/00* (2006.01)
*H03K 3/037* (2006.01)

(52) U.S. Cl.
CPC ........... *H03K 5/1252* (2013.01); *H03K 5/159* (2013.01); *H03K 3/037* (2013.01); *H03K 2005/00234* (2013.01)

(58) Field of Classification Search
CPC ......... H03K 19/0008; H03K 19/00361; H03K 3/84; H03K 4/56; H03K 5/1252; H03K 5/159; H03K 3/037
USPC ......................................... 327/262; 323/223
See application file for complete search history.

(56) References Cited

U.S. PATENT DOCUMENTS

| | | | | |
|---|---|---|---|---|
| 5,812,626 A | * | 9/1998 | Kusumoto | G01R 29/02 327/271 |
| 6,605,929 B2 | | 8/2003 | Tsukagoshi et al. | |
| 6,642,801 B1 | * | 11/2003 | Zortea | H03K 5/135 331/1 A |
| 6,826,247 B1 | * | 11/2004 | Elliott | G09G 5/008 327/150 |
| 7,526,390 B2 | * | 4/2009 | Kajita | G01R 19/16552 702/182 |
| 2009/0021407 A1 | * | 1/2009 | Terazawa | H03M 1/502 341/122 |
| 2014/0002136 A1 | * | 1/2014 | Greene | H03K 19/02 326/93 |

OTHER PUBLICATIONS

Wang et al., "TRO: An On-chip Ring Oscillator Based GHz Transient IR-Drop Monitor," IEEE on Computer-Aided Design (TCAD), 2016, 14 pages.

(Continued)

*Primary Examiner* — John Poos

(57) ABSTRACT

An integrated circuit includes a clock generator to generate a first clock signal, a delay circuit to generate a second clock signal as a delayed version of the first clock signal, and a plurality of series-connected delay elements having a plurality of outputs, wherein each output from an initial output to a last output is configured to provide the second clock signal delayed by an increasing number of series-connected delay elements. The circuit includes a plurality of flip-flops, wherein a first input of each flip flop is coupled to receive the first clock signal and a second input of each flip flop from an initial flip-flop to a last flip-flop is coupled to receive a corresponding output of the series-connected delay elements from the initial output to the last output, respectively. The circuit includes a plurality of sticky flops, each corresponding to a flip-flop of the plurality of flip-flops.

20 Claims, 3 Drawing Sheets

(56) References Cited

OTHER PUBLICATIONS

Aoki et al., "On-chip Voltage Noise Monitor for Measuring Voltage Bounce in Power Supply Lines Using a Digital Tester," IEEE, Proceedings of the 2000 International Conference on Microelectronic Test Structures, 6 pages.

* cited by examiner

POWER SUPPLY NOISE SENSOR

BACKGROUND

Field

This disclosure relates generally to sensing power supply noise, and more specifically, to a power supply noise sensor that is immune process variation and uses an independent clock.

Related Art

As technology goes into submicron era, power-supply noise (PSN) becomes a severe issue, due to the increased circuitry complexity and manufacturing imperfection. To accurately measure and quantitatively evaluate the PSN requires a lot of design effort. Many designs have been proposed. However, existing PSN sensors either fall into the analog-design domain or, as a digital sensor, highly rely on the system clock to trigger and perform the measurement, both of which have to trade-off other design specifications: Analog-designed PSN sensor usually are cumbersome and is not preferred to be widely implemented into a design due to the unavoidable area-overhead; Most digitally-designed PSN sensors depend on the system clock as a reference to evaluate the noise level. More importantly, the existing PSN sensors have to be well-calibrated first to compensate process variation and temperature imbalance. This "redundant calibration step" makes the existing PSN sensors difficult to use in-field and incur much measurement inaccuracy. Thinking of process variation, in most existing PSN sensor systems, each sensor cell has to be calibrated individually. A general calibration with a unique control sequence for all PSN sensors is not reliable for the sake that the actual silicon variation is not predictable. Furthermore, existing PSN sensors were designed in a way that highly relies on a time-consuming pre-silicon simulation to cover all variation corners. These prerequisites make the existing designs even more difficult to transfer from one product to another. In other words, the portability of the existing sensor designs is poor.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of power supply noise (PSN) sensors are disclosed in which a stable power source is used to operate the PSN sensors including a dedicated clock, a half-cycle delay circuit, and a series of flops in a delay capture circuit. Inverters and buffers in delay capture circuit are powered by a noisy power source which is being monitored for power-supply noise and IR-drop. In addition, the clock generation circuit is well-isolated to avoid causing electromagnetic interference and internal noise to other components. In this way, the clock duty cycle will not change and the internal distribution of sensor components can be minimized to obtain better measurement results.

Figure 1:
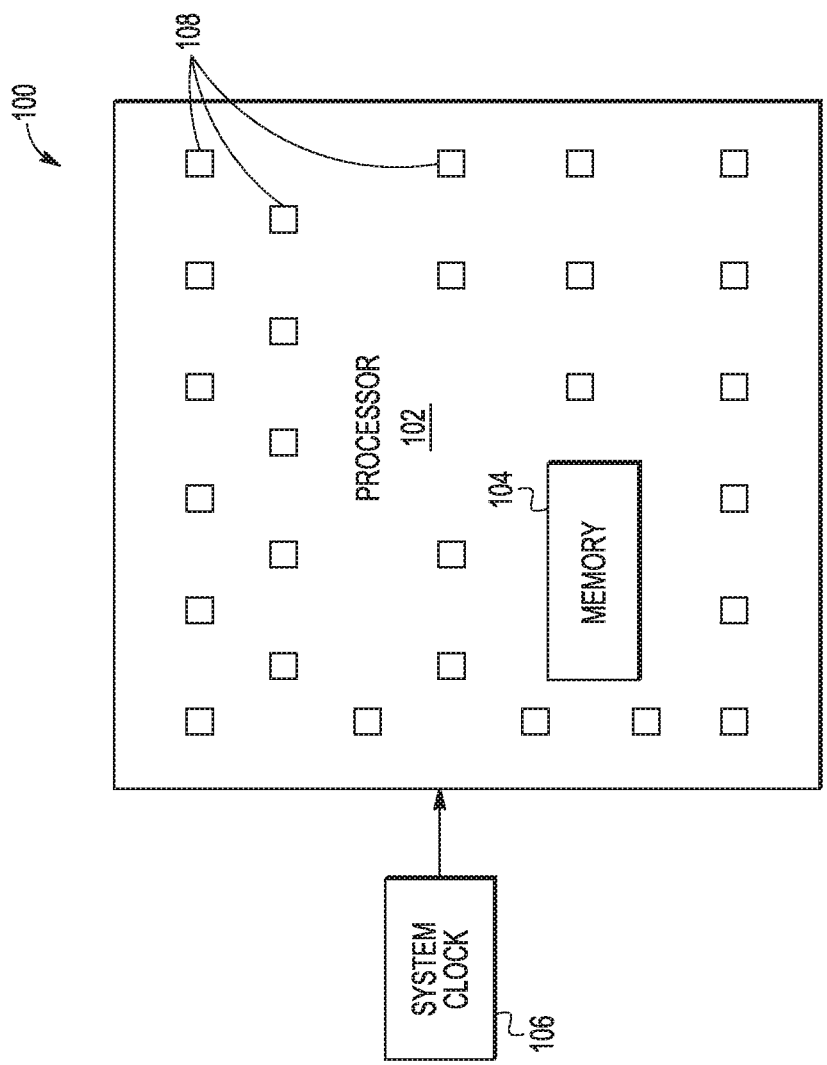
FIG. 1 illustrates a block diagram of a processing system with power supply noise sensors in accordance with selected embodiments of the invention.

FIG. 1 illustrates a block diagram of a processing system 100 with processor 102 and memory device 104 coupled to system clock 106 in accordance with selected embodiments of the invention. Power supply noise (PSN) sensors 108 can be placed in several different locations in processor 102 to detect IR drops in a power supply that may prevent components of processor 102 from operating as expected. Processor 102 can be any suitable processing device used in personal communication devices, industrial equipment, consumer products, and land, air and sea vehicles, among others. Processing system 100 can be implemented using any suitable integrated circuit semiconductor technology such as complementary metal-oxide semiconductor technologies. Memory device 104 can be any suitable volatile and/or non-volatile random access memory, cache memory, and/or other suitable type of memory. System clock 106 provides a clock signal that is used by processor 102 while PSN sensors 108 includes a clock generator that generates a clock signal that is used within PSN sensors 108 independently of a clock signal that is provided by system clock 106.

Figure 2:
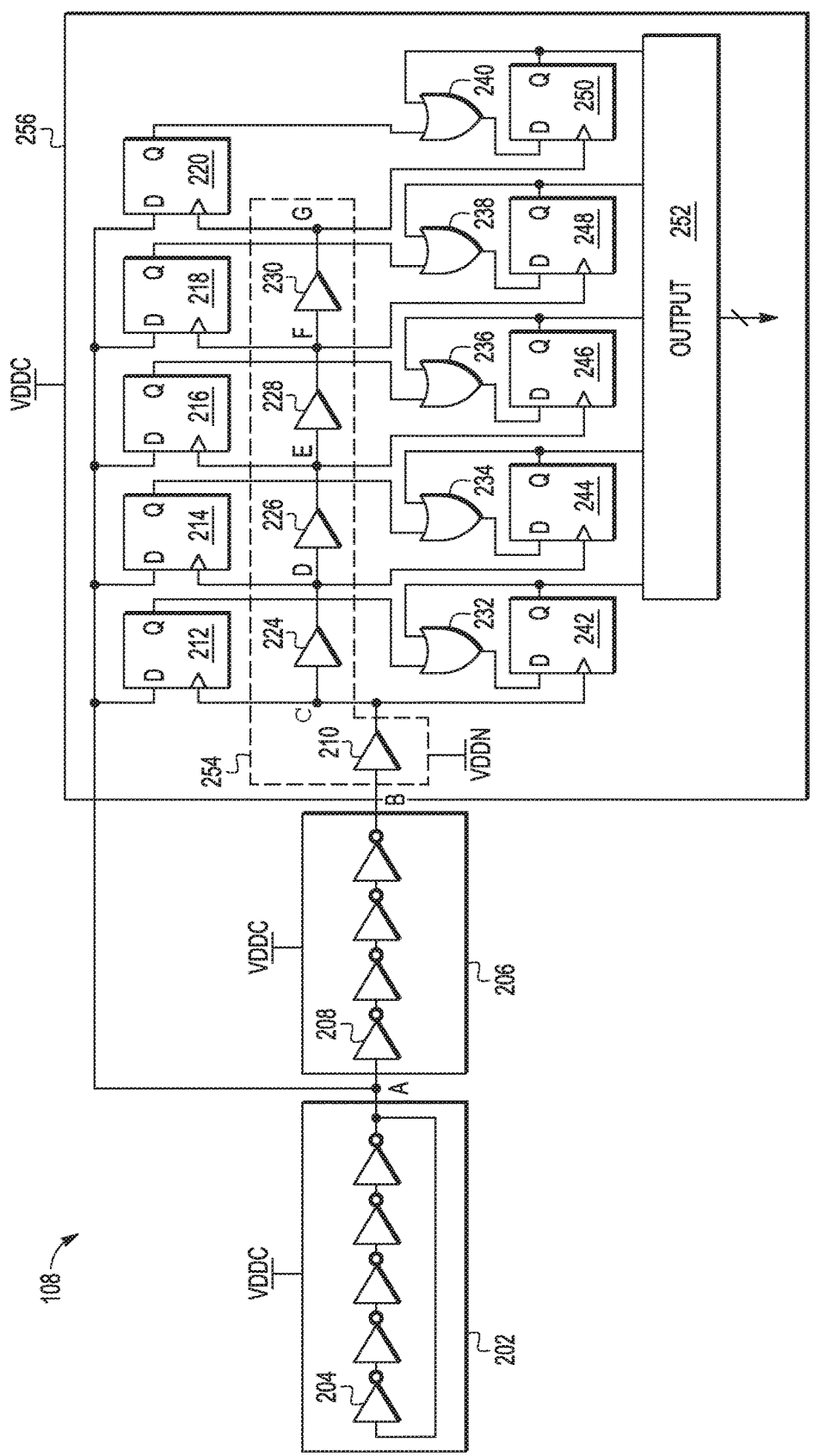
FIG. 2 illustrates a block diagram of an embodiment of a power supply noise sensor than can be used in the processing system of FIG. 1.

FIG. 2 illustrates a block diagram of an embodiment of a power supply noise sensor 108 than can be used in the processing system 100 of FIG. 1 that includes clock generator or clock generator 202, half-cycle delay circuit 206 coupled to the output of clock generator 202, and delay capture circuit 256 coupled to the outputs of clock generator 202 and half-cycle delay circuit 206. Clock generator 202 includes five inverters 204 coupled in series with the output of the last inverter 204 coupled to the input of the first inverter 204. Half-cycle delay circuit 206 includes four inverters 208 coupled in series, with the input the first inverter 208 in the series coupled to the output of clock generator 202 and each subsequent inverter 208 coupled to the output of a corresponding previous inverter 208. Clock generator 202 includes an odd number of inverters 204 and half-cycle delay circuit 206 includes an even number of inverters 208 that is one less than the number of inverters 204 in clock generator 202.

The basic equation for the frequency of clock generator 202 is given by:

$$f_0 = 1/2N\tau_d$$

where N is the count of stages in the clock generator and $\tau_d$ is the inverter propagation delay in each stage of the clock generator. Note that highly-balanced inverters 204 of the same gate type from a standard cell library can be used to ensure the rising and falling delays are quite close or even equal. If treated as a clock source, the output signal of clock generator 202 has a period of:

$$T = 1/f_0 = 2N\tau_d.$$

Half-cycle delay circuit 206 can be implemented with inverters 208 of the same gate type as used in the clock generator 202 to avoid the process variation and minimize the impact from temperature unbalance.

By using homogeneous gates in half-cycle delay circuit 206 and clock generator 202, it is feasible and convenient to use a first order linear model to characterize the delays due to process variation as in the following equations:

$$T_c = \text{clock generator } 202 * (1+\sigma_c)$$

$$T_d = T_{d0} * (1+\sigma_c)$$

where $\sigma_c$ indicates the delay increase (in percentage) of the cycle time of clock generator 202 and the delay time $T_c$ passing the half-cycle delay circuit 206 due to global variation. $T_d$ and $T_{d0}$ are the nominal cycle time of clock generator 202 and nominal delay of the half-cycle delay circuit 206 separately without variation impact. Process variation can be categorized as global variation and local variation. Layout of PSN sensor 108 can be designed to minimize the local variation as much as possible in a small-size digital block such as PSN sensor 108. In addition, using transistors with homogenous gates in clock generator 202 and nominal delay of the half-cycle delay circuit 206 makes it more feasible to use a single percentage value to characterize the delay increase. Capacitive load and propagation delay of interconnects inside PSN sensor 108 are negligible. The delay of half-cycle delay circuit 206 is equal to half the cycle time of clock generator 202. Thus:

$$T_{d0}/T_d = \tfrac{1}{2}$$

where $T_{d0} = N\tau_d$, and N is the count of stages in half-cycle delay circuit 206. Considering process variation, the cycle time and delay will increase to $T_c$ and $T_d$. However, the proportionality is still maintained by using the same gate in the transistors, as can be seen from the following equation:

$$T_d/T_c = [T_{d0}*(1+\sigma_c)]/[T_0*(1+\sigma_c)] = T_{d0}/T_0 = \tfrac{1}{2}.$$

The signal output by clock generator 202 is provided as input to a chain of inverters 208 in half-cycle delay circuit 206 as well as directly to a data input of each flip-flop circuit in a chain of flip-flop circuits 212-220 in delay capture circuit 256. The pipelined clock signal from half-cycle delay circuit 206 is provided to inverter 210 of delay capture circuit 256. The output of inverter 210 is provided to a clock input of flip-flop circuit 212, and to a clock input of first flip-flop circuit 242 in another chain of sticky flip-flop circuits 242-250 in delay capture unit 256.

The output of each flop 212-220 is provided as a first input to a corresponding OR gate 232-240. The output of each of sticky flops 242-250 is provided as a second input to a corresponding OR gate 232-240 and to output circuit 252. For example, the output of flip-flop circuit 212 is provided to a first input of OR gate 232, the output of flip-flop circuit 242 is provided as a second input to OR gate 232; the output of flip-flop circuit 214 is provided to a first input of OR gate 234, the output of flip-flop circuit 244 is provided as a second input to OR gate 234, and so on. The output of OR gates 232-240 is provided to a data input of a corresponding sticky flip-flop circuit 242-250. The output of inverter 210 is further provided to a chain of buffers 224-230 in delay capture circuit 256. The output of each buffer 224-230 is provided to a subsequent inverter 226-230 in the chain. The output of subsequent inverters 226-230 is provided to the clock input of corresponding flip-flop circuits 214-220 and 244-250. For example, the output of buffer 224 is provided to the clock input of flip-flop circuits 214 and 244; the output of buffer 226 is provided to the clock input of flip-flop circuits 216 and 246, and so on.

In some implementations, clock generator 202, half-cycle delay circuit 206, and all components in delay capture circuit 256 except buffers 224-230 operate on a clean power source VDDC, while buffers 210-230 operate on a noisy power source VDDN. In other implementations, all components in PSN sensor 108 can be powered with the noisy source VDDN.

Without IR-drop, flip-flop circuits 212-220, 242-250 will capture "0" because the clock signal of flip-flop circuits 212-220, 242-250 always arrives half cycle later than the signal output by clock generator 202, which is provided directly to the data input of flip-flop circuits 212-220. Considering fanout capacitance, IR-drop causes more delay to each buffer 228-230 in delay capture circuit 256 than the preceding buffers 210-226. Depending on the IR-drop level, extra delay caused by IR-drop will accumulate, causing some flip-flop circuits 212-220, 242-250 to capture "1". The number of flip-flop circuits 212-220, 242-250 that capture a "1" depends on the extent of the IR drop. The greater the IR drop, the greater the number of flip-flop circuits 212-220, 242-250 that will capture "1", starting from anchor flip-flop circuits 220, 250 and moving toward the left in the respective chain of flip-flop circuits 212-218, 242-248.

Figure 3:
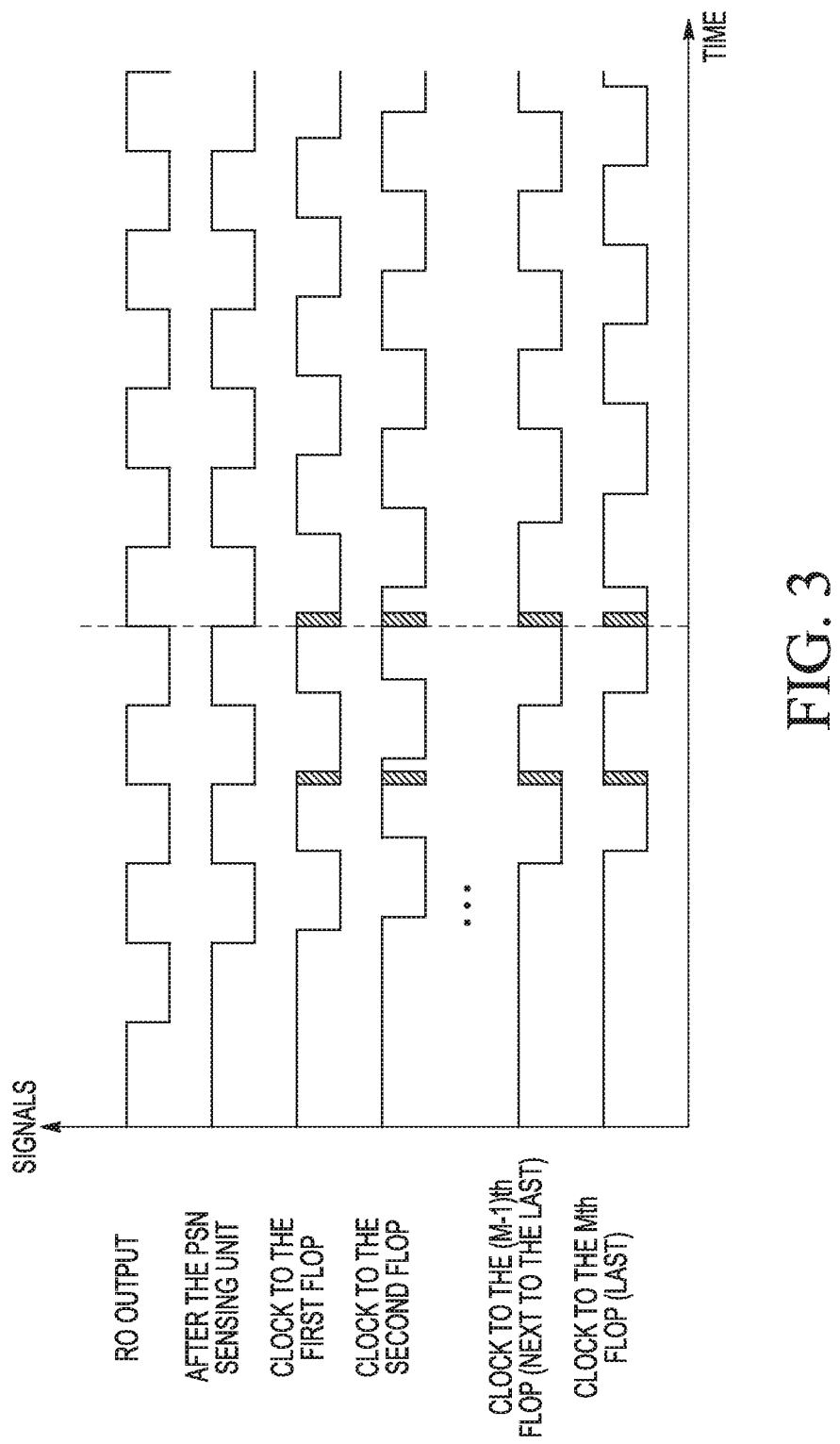
FIG. 3 illustrates timing diagrams for the power supply noise sensor of FIG. 2.

Referring to FIGS. 2 and 3, FIG. 3 illustrates timing diagrams for PSN sensor 108 of FIG. 2 when IR-drop occurs while high voltage output of the clock generator 202 is traversing through half-cycle delay circuit 206. The diagram labeled Node A is the signal output from the clock generator 202. The diagram labeled Node B is the signal output from half-cycle delay circuit 206, which is delayed half cycle proportional to the clock cycle time. The diagram labeled Node C is the signal output by inverter 210. The diagrams labeled Node D, E, F, and G are the signals output by respective buffers 224, 226, 228, and 230.

Before the IR-drop happens at time T1, almost all the flops capture "0". From the right end of delay capture unit 256, some flip-flop circuits 212-220, starting with flip-flop circuits 220, 256 may capture "1". The number of flip-flop circuits 212-220, 242-250 that capture "1" depends on the number of flip-flop circuits 212-220, 242-250 in delay capture circuit 256. More redundant flip-flop circuits 212-220, 242-250 offers more flexibility, while more stages may not be needed to measure the delay increase due to the use of sticky flip-flop circuits 242-250 to store the captured values. The number of flip-flop circuits 212-220, 242-250 used may be decided during the design stage and by analyzing the design specifications. If no redundant flip-flop circuits 212-220, 242-250 are included, all flip-flop circuits 212-220, 242-250 will capture "0" during no IR-drop periods. Once the IR-drop happens after time t1, the output signal of clock generator 202 passing through buffers 224-230 will be delayed due to the additional propagation delay caused by the IR-drop. The delay increase will be accumulated and some flip-flop circuits 212-220, 242-250 starting from flip-flop circuits 22, 250 will capture "1". Theoretically speaking, the number m of flip-flop circuits 212-220, 242-250 capturing "0" can be evaluated using the following equation:

$$T_0'/2 \geq m * \tau_d''$$

where $T_0'$ is the cycle time of clock generator 202 with IR-drop, $\tau_d''$ is the delay in buffers 224-230 with IR-drop in delay capture circuit 256, and m indicates the count of flip-flop circuits 212-220, 242-250 which will still capture "0" in delay capture circuit 256. With homogeneous gates in the both half-cycle delay circuit 206 and clock generator 202, the following approximation is valid:

$$T_0'/2 = T_{d0}' = N*\tau_d'$$

where $T_{d0}'$ is the delay with IR-drop in half-cycle delay circuit 206, $\tau_d'$ is the buffer delay with IR-drop in half-cycle delay circuit 206. As a result, $$m = \text{floor}(N*\tau_d'/\tau_d'')$$

where floor indicates the floor function, which gives the largest less than or equal to integer of m flip-flop circuits 212-220, 242-250 that will capture "0". The variables $\tau_d'$ and $\tau_d$" are not the same because their capacitive loads are significantly different. Assuming there are M total delay buffers 224-230 in delay capture circuit 256, $$\Delta M = (M - m - 1)$$

flip-flop circuits 212-220, 242-250 starting from flip-flop circuits 220, 250 at the right will capture "1". ΔM approximates the delay induced by IR-drop.

Compared with existing PSN sensors, embodiments of PSN sensors 108 disclosed herein are smaller in size and use homogeneous gates, which helps make the sensors 108 immune to process and temperature variation. Further, embodiments of PSN sensors 108 disclosed herein use existing standard cells from a technology library, as well as a local clock generator to generate the signal for measurement. Using standard cells and a local internal clock generator 202 ensures that the design is independent of a system clock and is portable to different designs using the same technology. Also, using standard cells to construct PSN sensors 108 reduces the design time and allows PSN sensors 108 to transfer from a specific technology node to another without modification while only the gate types need to be substituted.

In summary, the IR-drop event can be sensed by the clock signal. The extra delay caused by IR-drop can be captured by delay capture circuit 256. Counting the number of flip-flop circuits 212-220, 242-250 storing "1" in delay capture circuit 256 can approximate the delay due to the IR-drop. In addition, the proposed PSN sensor 108 can detect IR-drop induced delay as low as to a buffer's propagation delay. Once the IR-drop disappears, the cycle time of clock generator 202 will converge to its original value. The first-level flip-flop circuits 212-220 in delay capture circuit 256 will latch all "0" again. Since flip-flop circuits 242-250 are designed as sticky-to-1 cells, captured "1 s" will be maintained for analysis.

By now is should be appreciated that in some embodiments, an integrated circuit can include a clock generator (202) configured to generate a first clock signal, a delay circuit (206) coupled to the clock generator and configured to generate a second clock signal as a delayed version of the first clock signal, and a plurality of series-connected delay elements (254) coupled to receive the second clock signal from the delay circuit and having a plurality of outputs. Each output of the plurality of outputs from an initial output to a last output is configured to provide the second clock signal delayed by an increasing number of series-connected delay elements of the plurality of series-connected delay elements. A plurality of flip-flops (212, 214, 216, 218), from an initial flop-flop to a last flip-flop are also included. A first input of each flip flop is coupled to receive the first clock signal and a second input of each flip flop from the initial flip-flop to the last flip-flop is coupled to receive a corresponding output of the plurality of series-connected delay elements from the initial output to the last output, respectively. A plurality of sticky flops (242,244,246,248), each corresponding to a flip-flop of the plurality of flip-flops are also included. A clock input of each sticky flop is coupled to receive the corresponding output of the plurality of series-connected delay elements that is provided to the second input of the corresponding flip-flop, and a data input of each sticky flop is generated from a data output of the sticky flop and a data output of the corresponding flip-flop.

In another aspect, each sticky flop can be configured to store an indication of whether a transition of the data output of the corresponding flip-flop has occurred.

In another aspect, the delay circuit can be configured to provide a delay of half a clock cycle of the first clock signal.

In another aspect, each series-connected delay element can be configured to provide a same delay.

In another aspect, the clock generator can comprise a clock generator having an odd number of inverters.

In another aspect, a delay time through the odd number of inverters of the clock generator can equal a delay time through the delay circuit.

In another aspect, the delay circuit can comprise an even number of inverters.

In another aspect, the integrated circuit can be configured to detect power-supply noise of a first power supply. The plurality of series-connected delay elements are each configured to be powered by the first power supply.

In another aspect, the clock generator, delay unit, plurality of flip-flops, and plurality of sticky flops can be configured to be powered by the first power supply.

In another aspect, the clock generator, delay unit, plurality of flip-flops, and plurality of sticky flops can be configured to be powered by a clean power supply.

In another aspect, the integrated circuit can further comprise an additional delay element (230) connected in series with the last output of the series-connected delay elements and configured to provide an additional output corresponding to the last output delayed by the additional delay element. An anchor flip flop (220) having a first input can be coupled to receive the first clock signal and a second input coupled to receive the additional output of the buffer circuitry. An anchor sticky flop (240) can correspond to the anchor flip-flop. The clock input of the anchor sticky flop can be coupled to receive the additional output and a data input of the anchor sticky flop can be generated from a data output of the anchor sticky flop and a data output of the anchor flip-flop.

In another aspect, the first input of each flip-flop of the plurality of flip-flops can be characterized as a data input, and the second input of each flip-flop of the plurality of flip-flops is characterized as a clock input.

In other selected embodiments, an integrated circuit configured to detect power-supply noise of a first power supply coupled to a first power supply terminal can comprise a clock generator configured to generate a first clock signal, a delay circuit coupled to the clock generator and configured to generate a second clock signal as a delayed version of the first clock signal, a first buffer (210) coupled to the first power supply terminal, having an input coupled to receive the second clock signal and having an output, a second buffer (226) coupled to the first power supply terminal having an input coupled to the output of the first buffer and having an output, a first flip-flop (212) having a data input coupled to receive the first clock signal and having a clock input coupled to the output of the first buffer, a second flip-flop (214) having a data input coupled to receive the first clock signal and having a clock input coupled to the output of the second buffer, a first sticky flop (242) having a clock input coupled to the output of the first buffer, and a data input coupled to a logical combination of a data output of the first flip-flop and a data output of the first sticky flop, and a second sticky flop (244) having a clock input coupled to the output of the second buffer, and a data input coupled to a logical combination of a data output of the second flip-flop and a data output of the second sticky flop. The data outputs of the first and second sticky flops indicate whether there is noise on the first power supply.

In another aspect, the first sticky flop can be configured to store an indication of whether a transition of the data output of the first flip-flop has occurred, and the second sticky flop is configured to store an indication of whether a transition of the data output of the second flip-flop has occurred.

In another aspect, the delay circuit can be configured to provide a delay of half a clock cycle of the first clock signal.

In another aspect, each of the first buffer and the second buffer can be configured to provide a same delay.

In another aspect, the clock generator can comprise a clock generator having an odd number of inverters.

In another aspect, the logical combination of the data output of the first flip-flop and the data output of the first sticky flop can comprise a logical ORing of the data output of the first flip-flop and the data output of the first sticky flop, and the logical combination of the data output of the second flip-flop and the data output of the second sticky flop comprises a logical ORing of the data output of the second flip-flop and the data output of the second sticky flop.

In another aspect, the clock generator, delay unit, first and second flip-flops, and first and second sticky flops can each coupled to the first power supply terminal.

In another aspect, the clock generator, delay unit, first and second flip-flops, and first and second sticky flops can be each coupled to a clean power supply terminal.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a clock generator configured to generate a first clock signal;
   a delay circuit coupled to the clock generator and configured to generate a second clock signal as a delayed version of the first clock signal;
   a plurality of series-connected delay elements coupled to receive the second clock signal from the delay circuit and having a plurality of outputs, wherein each output of the plurality of outputs from an initial output to a last output is configured to provide the second clock signal delayed by an increasing number of series-connected delay elements of the plurality of series-connected delay elements;
   a plurality of flip-flops, from an initial flop-flop to a last flip-flop, wherein a first input of each flip flop is coupled to receive the first clock signal and a second input of each flip flop from the initial flip-flop to the last flip-flop is coupled to receive a corresponding output of the plurality of series-connected delay elements from the initial output to the last output, respectively; and
   a plurality of sticky flops, each corresponding to a flip-flop of the plurality of flip-flops, wherein a clock input of each sticky flop is coupled to receive the corresponding output of the plurality of series-connected delay elements that is provided to the second input of the corresponding flip-flop, and a data input of each sticky flop is generated from a data output of the sticky flop and a data output of the corresponding flip-flop.

2. The integrated circuit of claim 1, wherein each sticky flop is configured to store an indication of whether a transition of the data output of the corresponding flip-flop has occurred.

3. The integrated circuit of claim 1, wherein the delay circuit is configured to provide a delay of half a clock cycle of the first clock signal.

4. The integrated circuit of claim 1, wherein each series-connected delay element is configured to provide a same delay.

5. The integrated circuit of claim 1, wherein the clock generator comprises a clock generator having an odd number of inverters.

6. The integrated circuit of claim 5, wherein a delay time through the odd number of inverters of the clock generator equals a delay time through the delay circuit.

7. The integrated circuit of claim 6, wherein the delay circuit comprises an even number of inverters.

8. The integrated circuit of claim 1 wherein the integrated circuit is configured to detect power-supply noise of a first power supply, and wherein the plurality of series-connected delay elements are each configured to be powered by the first power supply.

9. The integrated circuit of claim 8, wherein the clock generator, delay unit, plurality of flip-flops, and plurality of sticky flops are configured to be powered by the first power supply.

10. The integrated circuit of claim 8, wherein the clock generator, delay unit, plurality of flip-flops, and plurality of sticky flops are configured to be powered by a clean power supply.

11. The integrated circuit of claim 1, further comprising:
- an additional delay element connected in series with the last output of the series-connected delay elements and configured to provide an additional output corresponding to the last output delayed by the additional delay element;
- an anchor flip flop having a first input coupled to receive the first clock signal and a second input coupled to receive the additional output of the buffer circuitry; and
- an anchor sticky flop corresponding to the anchor flip-flop, wherein the clock input of the anchor sticky flop is coupled to receive the additional output and a data input of the anchor sticky flop is generated from a data output of the anchor sticky flop and a data output of the anchor flip-flop.

12. The integrated circuit of claim 1, wherein the first input of each flip-flop of the plurality of flip-flops is characterized as a data input, and the second input of each flip-flop of the plurality of flip-flops is characterized as a clock input.

13. An integrated circuit configured to detect power-supply noise of a first power supply coupled to a first power supply terminal, comprising:
- a clock generator configured to generate a first clock signal;
- a delay circuit coupled to the clock generator and configured to generate a second clock signal as a delayed version of the first clock signal;
- a first buffer coupled to the first power supply terminal, having an input coupled to receive the second clock signal, and having an output;
- a second buffer coupled to the first power supply terminal, having an input coupled to the output of the first buffer, and having an output;
- a first flip-flop having a data input coupled to receive the first clock signal and having a clock input coupled to the output of the first buffer;
- a second flip-flop having a data input coupled to receive the first clock signal and having a clock input coupled to the output of the second buffer;
- a first sticky flop having a clock input coupled to the output of the first buffer, and a data input coupled to a logical combination of a data output of the first flip-flop and a data output of the first sticky flop; and
- a second sticky flop having a clock input coupled to the output of the second buffer, and a data input coupled to a logical combination of a data output of the second flip-flop and a data output of the second sticky flop, wherein the data outputs of the first and second sticky flops indicate whether there is noise on the first power supply.

14. The integrated circuit of claim 13, wherein the first sticky flop is configured to store an indication of whether a transition of the data output of the first flip-flop has occurred, and the second sticky flop is configured to store an indication of whether a transition of the data output of the second flip-flop has occurred.

15. The integrated circuit of claim 13, wherein the delay circuit is configured to provide a delay of half a clock cycle of the first clock signal.

16. The integrated circuit of claim 13, wherein each of the first buffer and the second buffer is configured to provide a same delay.

17. The integrated circuit of claim 13, wherein the clock generator comprises a clock generator having an odd number of inverters.

18. The integrated circuit of claim 13, wherein the logical combination of the data output of the first flip-flop and the data output of the first sticky flop comprises a logical ORing of the data output of the first flip-flop and the data output of the first sticky flop, and the logical combination of the data output of the second flip-flop and the data output of the second sticky flop comprises a logical ORing of the data output of the second flip-flop and the data output of the second sticky flop.

19. The integrated circuit of claim 13, wherein the clock generator, delay unit, first and second flip-flops, and first and second sticky flops are each coupled to the first power supply terminal.

20. The integrated circuit of claim 13, wherein the clock generator, delay unit, first and second flip-flops, and first and second sticky flops are each coupled to a clean power supply terminal.

* * * * *